United States Patent [19]

Fenk

[11] Patent Number: 4,843,340
[45] Date of Patent: Jun. 27, 1989

[54] MONOLITHICALLY INTEGRABLE CONTROLLER CIRCUIT

[75] Inventor: Josef Fenk, Eching/Ottenburg, Fed. Rep. of Germany

[73] Assignee: Siemens Aktiengesellschaft, Munich, Fed. Rep. of Germany

[21] Appl. No.: 220,614

[22] Filed: Jul. 18, 1988

[30] Foreign Application Priority Data

Jul. 17, 1987 [DE] Fed. Rep. of Germany ....... 3723752

[51] Int. Cl.$^4$ ............................................. H03F 3/68
[52] U.S. Cl. ..................................... 330/126; 328/26; 330/295
[58] Field of Search ................. 330/69, 126, 258, 295; 328/26; 329/192; 331/109, 177 R, 182, 183; 363/127

[56] References Cited

U.S. PATENT DOCUMENTS 4,479,259 10/1984 Fenk ..................................... 455/318
4,513,320 4/1985 Reneau et al. ................... 330/258 X
4,588,968 5/1986 Wile ..................................... 331/109

FOREIGN PATENT DOCUMENTS 3041392 8/1964 Fed. Rep. of Germany .
2929355 2/1981 Fed. Rep. of Germany .

Primary Examiner—James B. Mullins
Attorney, Agent, or Firm—Herbert L. Lerner; Laurence A. Greenberg

[57] ABSTRACT

A monolithically integrable controller circuit, particularly for amplitude control in oscillator amplifiers, providing an actual-value detection by rectification, an input signal means-value suppression with a differential amplifier, and a set-point setting, includes a signal input of the controller circuit connected to the base contact of a first transistor. A low-pass filter is connected to the base contact of a second transistor and to the signal input. The collector contacts of the first and second transistors are connected to a potential. The emitter contact of the first transistor is connected to one of the inputs of the operational amplifier. A first capacitor is connected between the emitter contact of the first transistor and reference potential. A first constant current source is connected between the emitter contact of the first transistor and reference potential. The emitter contact of the second transistor is connected to the other of the inputs of the operational amplifier. A second constant current source is connected between the emitter contact of the second transistor and the reference potential. An output of the controller is connected to the output of the operational amplifier. The ratio of the current of the second constant current source to the current of the first constant current source provides set-point setting.

10 Claims, 1 Drawing Sheet

MONOLITHICALLY INTEGRABLE CONTROLLER CIRCUIT

The invention relates to a monolithically integrable controller circuit which can be used, in particular, for amplitude control in oscillator amplifiers and in which an actual-value detection by means of rectification, an input signal mean-value suppression through the use of a differential amplifier, and a set-point setting, are provided German Patent DE-PS No. 30 41 392 discloses a controller circuit, in which the input signals are rectified, the undesirable signal components that are not part of the control variable are eliminated by means of the common mode suppression of the differential amplifier input of an operational amplifier circuit, and set value setting means are provided.

In the aforementioned German Patent, the controller has two a symmetrical output signal of a differential amplifier and for full-course rectification of this signal. The output of each rectifier is respectively connected to one input of an operational amplifier. The output signal of the operational amplifier and thus of the control system is proportional to the differential signal of the two input signals. If the signal present at the two inputs is in the form of a symmetrically decoupled differential amplifier output signal having a push-pull alternating voltage component as well as a direct voltage component and disturbance in the form of common-mode alternating voltage components, then the common-mode components are suppressed by the controller and only the push-pull component of the input signal affects the output signal of the controller. The proportionality factor between the input differential signal and the output signal and therefore the set-point value of the controller are fixed by means of a direct voltage difference between the two inputs of the operational amplifier, especially in the circuit shown in FIG. 2 of German Patent DE-PS No. 30 41 392. This direct voltage difference is attained by means of additional DC operating point setting means, at least at one operational amplifier input, and these setting means typically include a plurality of resistors.

Among the disadvantages of a circuit in accordance with the above-described prior art are the additional expense for components required in order to set the operating point at the operational amplifier inputs of the controller and the direct dependency of the actual set-point value on the constancy of the operating point voltage of the operational amplifier. Furthermore, the controller circuit described in German Patent DE-PS No. 30 41 392 can only be suitably used for controlling differential amplifier pairs having symmetrical actual-value decoupling.

It is accordingly an object of the invention to provide a monolithically integrable controller circuit having a single signal input, which overcomes the hereinafore-mentioned disadvantages of the heretofore-known devices of this general type and in which the components of the input signal that are located below a predetermined threshold frequency, for instance below the desired signal frequency, are eliminated by the common mode suppression of an operational amplifier. The expense for components should also be reduced.

With the foregoing and other objects in view there is provided, in accordance with the invention, a monolithically integrable controller circuit, particularly for amplitude control in oscillator amplifiers, providing an actual-value detection by rectification, an input signal mean-value suppression with a differential amplifier, and a set-point setting, comprising first and second transistors each having an emitter contact, a collector contact and a base contact, an operational amplifier having two inputs and an output, a signal input of the controller circuit connected to the base contact of the first transistor, a low-pass filter connected to the base contact of the second transistor and to the signal input, the collector contacts of the first and second transistors being connected to a potential, the emitter contact of the first transistor being connected to one of the inputs of the operational amplifier, a first capacitor connected between the emitter contact of the first transistor and reference potential, such as ground, a first constant current source connected between the emitter contact of the first transistor and reference potential, the emitter contact of the second transistor being connected to the other of the inputs of the operational amplifier, a second constant current source connected between the emitter contact of the second transistor and the reference potential, and an output of the controller connected to the output of the operational amplifier, whereby the ratio of the current of the second constant current source to the current of the first constant current source provides set-point setting.

In accordance with another feature of the invention, there are provided third and fourth constant current sources, a third transistor having emitter, collector and base contacts and being connected between the first transistor and the one input of the operational amplifier forming a Darlington stage, the emitter contact of the first transistor being connected to the base contact of the third transistor Tc, the emitter contact of the third transistor being connected to the one input of the operational amplifier and through the third constant current source to the reference potential, such as ground: a fourth transistor having emitter, collector and base contacts and being connected between the second transistor and the other input of the operational amplifier forming another Darlington stage, the emitter contact of the second transistor being connected to the base contact of the fourth transistor, the emitter contact of the fourth transistor being connected to the other input of the operational amplifier and through the fourth constant current source to the reference potential, the collector contacts of the third and the fourth transistors each being connected to a potential; whereby in addition to the ratio of the current of the first constant current source to the current of the second constant current source, the ratio of the ratios of the current of the third constant current source to the current of the first constant current source to the ratio of the current of the fourth constant current source to the current of the second constant current source provide the set-point value setting.

In accordance with a further feature of the invention, there is provided a potential connected to the collector contacts of the first and second transistors is a common first supply potential.

In accordance with an added feature of the invention, the one input of the operational amplifier connected to the emitter contact of the first transistor is a non-inverting input, and the other input of the operational amplifier connected to the emitter contact of the second transistor is an inverting input.

In accordance with an additional feature of the invention, there are provided fifth, sixth, seventh and eighth transistors having emitter, collector and base contacts, the fifth and the sixth transistors being of the same type, the seventh and the eighth transistors being of a type complementary to the type of the fifth and the sixth transistors, the base contact of the fifth transistor forming the inverting input of the operational amplifier, the base contact of the sixth transistor forming the non-inverting input of the operational amplifier, the collector contacts of the fifth and the sixth transistors being connected to a potential, such as the first supply potential, the emitter contact of the fifth transistor being connected to the emitter contact of the seventh transistor and the emitter contact of the sixth transistor being connected to the emitter contact of the eighth transistor, the base contacts of the seventh and the eighth transistors being connected to the collector contact of the seventh transistor, other constant current sources each being connected between a respective one of the collector contacts of the seventh and the eighth transistors, and the reference potential, and the output of the operational amplifier connected to the output of the controller being the collector contact of the eighth transistor.

In accordance with a concomitant feature of the invention, there is provided a resistor connected between the base contact of the second transistor and the base contact of the first transistor, and a second capacitor connected between the base contact of the first transistor and the reference potential, such as ground.

Other features which are considered as characteristic for the invention are set forth in the appended claims.

Although the invention is illustrated and described herein as formed in a monolithically integrable controller circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
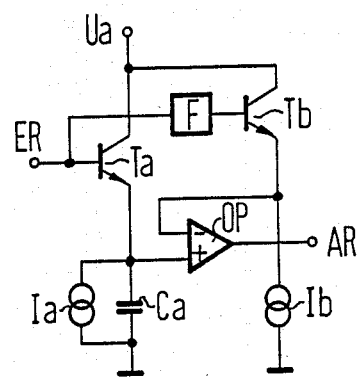
FIG. 1 is a basic schematic circuit diagram according to the invention.

Referring now to the figures of the drawings in detail and first, particularly, to FIG. 1 thereof, there is seen a circuit in which the base contact of a first transistor Ta is connected to a signal input ER of a controller circuit and the base contact of a second transistor Tb is also connected through a low-pass filter F to the signal input. The collector contacts of the first and second transistors are each connected to a potential, in particular a common first supply potential Ua. The emitter of the first transistor Ta is connected to one input of an operational amplifier OP, in particular the non-inverting input. The emitter of the first transistor Ta is also connected to reference potential (ground) through a first capacitor Ca as well as through a first constant current source Ia. The emitter of the second transistor Tb is connected to the other input of the operational amplifier OP, in particular the inverting input. Furthermore, the emitter of the second transistor Tb is connected through a second constant current source Ib to the reference potential (ground). The output of the operational amplifier is connected to an output AR of the controller. The ratio of the current of the second constant current source Ib to the current of the first constant current source Ia is provided for set-point adjustment.

The first transistor Ta is operated at the operating point at which the rectification efficiency of the transistor is optimal, due to a suitable selection of the current of the first constant current source Ia.

In other words, if a signal composed of alternating voltage components and a direct voltage component is fed to the signal input ER of the above-described circuit, then this signal is applied directly to the base contact of the first transistor Ta, and consequently a direct voltage is present at the emitter of the first transistor Ta that is composed of the one-way rectified components of all of the signal frequencies as well as the direct voltage component of the input signal. Only the part of the input signal having a frequency which is lower than the threshold frequency of the low-pass filter F is present at the base contact of the second transistor Tb. The higher-frequency components are damped. Therefore, there are also no components that originate from rectification of signals of higher frequencies present in the direct voltage applied to the emitter of the second transistor Tb. Thus, aside from a factor, the signal at the emitter of the first transistor only differs from the signal at the emitter of the second transistor by the rectified component of the input signal which has a frequency that is above the threshold frequency of the low-pass filter F. The direct voltage component of the input signal as well as the signal components having a frequency which is below the threshold frequency of the low-pass filter F, are taken into account in the same manner in the emitter output signals of the first and second transistors Ta, Tb. If the emitter output signal of the first transistor Ta is fed to the non-inverting input of the operational amplifier OP and the emitter output signal of the second transistor Tb is fed to the inverting input of the operational amplifier OP, then the output of the operational amplifier OP furnishes input signal components which are weighted with a factor and which have a frequency that is higher than the threshold frequency of the low-pass filter. The direct voltage component and the low-frequency disturbance components of the input signal of the circuit are not contained in this output signal, because of the high common-mode suppression of the operational amplifier OP. The factor with which the higher-frequency input signal components are weighted can be predetermined by the selection of the ratio between the current of the first constant current source Ia and the current of the second constant current source Ib. The variation of this current ratio thus permits a set-point value setting to be made. No further direct voltage addition is required at one of the inputs of the operational amplifier.

The ratio of the currents of the first constant current source Ia and the second constant current source Ib to one another also defines the control direction. The control direction is reversed by exchanging the operational amplifier inputs with one another.

Figure 2:
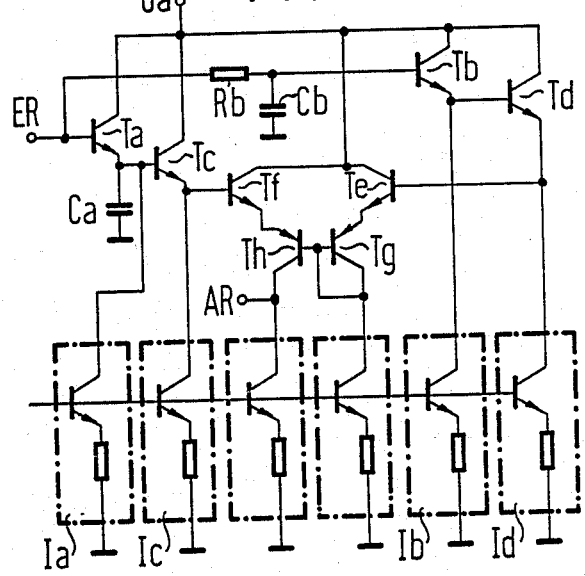
FIG. 2 is a schematic circuit diagram of a particularly favorable embodiment of the invention.

FIG. 2 shows a further favorable embodiment of the controller circuit described above, which differs from the circuit of FIG. 1 in that the emitter contact of the first transistor Ta is not directly connected to one input of the operational amplifier OP, but instead it is connected to the base contact of a third transistor Tc, in order to form a Darlington stage. The emitter contact of this third transistor Tc is connected to one input of the operational amplifier OP and through a third constant current source Ic to the reference potential. The emitter contact of the second transistor Tb is not directly connected to the other input of the operational amplifier OP but instead it is connected to the base contact of a fourth transistor Td, in order to form a Darlington stage. The emitter contact of the fourth transistor Td is connected to the other input of the operational amplifier OP and through a fourth constant current source Id to the reference potential. The collector of the third transistor Tc and the collector of the fourth transistor Td are each connected to a potential, in particular the first supply potential Ua. The base contact of a fifth transistor Te and the base contact of a sixth transistor Tf of the same type are respectively provided as the inverting input of the operational amplifier OP and as the non-inverting input of the operational amplifier OP. The collector contact of the fifth transistor and the collector contact of the sixth transistor are connected to a potential, in particular the first supply potential Ua. The emitter of the fifth transistor Te is connected to the emitter of a seventh transistor Tg and the emitter of the sixth transistor Tf is connected to the emitter of an eighth transistor Th. The type of the seventh and eighth transistors Tg, Th are complementary to the type of the fifth and sixth transistors Te, Tf. The base of the seventh transistor Tg and the base of the eighth transistor Th are connected to the collector of the seventh transistor Tg. The collectors of the seventh and eighth transistors Tg, Th are each connected through a respective constant current source to reference potential and the collector of the eighth transistor Th is provided as the output AR of the operational amplifier OP. The base contact of the second transistor Tb is connected through a second resistor Rb to the base contact of the first transistor Ta and through a second capacitor Cb to the reference potential.

In terms of direct voltage, in circuits according to FIG. 1, the potentials at the inputs of the operational amplifier only differ from the potential at the signal input of the control circuit by the voltage applied through a base-to-emitter path. The control range of the controller, which is affected by the ratio of the current of the first transistor Ta to the current of the second transistor Tb, is limited because of this slight potential difference, since a slight increase in the voltage difference leads to a relatively great increase of the current difference, yet an excessively great current difference prevents exact setting of the circuit, because of the logarithmic dependency of the current on the voltage. Due to the above-described series connection of the first and third transistors Ta, Tc and of the second and fourth transistors Tb, Td, two base-to-emitter paths are each located between the signal input of the controller and the operational amplifier inputs. In order to attain the same voltage difference, a considerably lesser current difference is therefore necessary between the currents of the Darlington stages Ta, Tc and Tb, Td in the circuits of FIG. 2 than between the currents of the first transistor Ta and second transistor Tb in the circuit of FIG. 1. In circuits according to FIG. 2, the set-point value is determined not only by the ratio of the current of the first constant current source Ia to the current of the second constant current source Ib, but also by the ratio of the ratio of the current of the third current source Ic to the current of the first current source Ia to the ratio of the current of the fourth current source Id to the current of the second current source Ib.

The operational amplifier in FIG. 2 is formed by a differential amplifier circuit that can be constructed in a space-saving manner, by having a current mirror and a constant current source.

In particular, as shown in FIG. 2, each of the constant current sources may be constructed as a base-grounded transistor having an emitter which is connected through a resistor to the reference potential, a base which is acted upon by a constant potential and a collector which is provided as a current input. With a constant base potential, the current of the current source is here defined by the resistor. If all of the current sources are formed in this way and the base contacts of all of the current source transistors are applied to the same reference potential, then the entire circuit can be made currentless as needed, by varying the reference potential.

If the threshold frequency of the low-pass filter can be selected to be sufficiently low in comparison with the signal frequency of the control variable, it is sufficient in some cases to provide the low-pass filter F as a first-order filter, which has a resistor between the input and output thereof and which has an output that is connected through a capacitor to the reference potential.

The foregoing is a description corresponding in substance to German Application P No. 37 23 752.7, dated July 17, 1987, the International priority of which is being claimed for the instant application, and which is hereby made part of this application. Any material discrepancies between the foregoing specification and the aforementioned corresponding German application are to be resolved in favor of the latter.

I claim:

1. Monolithically integrable controller circuit, particularly for amplitude control in oscillator amplifiers, providing an actual-value detection by rectification, an input signal meanvalue suppression with a differential amplifier, and a set-point setting, comprising first and second transistors each having an emitter contact, a collector contact and a base contact, an operational amplifier having two inputs and an output, a signal input of the controller circuit connected to the base contact of said first transistor, a low-pass filter connected to the base contact of said second transistor and to said signal input, the collector contacts of said first and second transistors being connected to a potential, the emitter contact of said first transistor being connected to one of said inputs of said operational amplifier, a first capacitor connected between the emitter contact of said first transistor and reference potential, a first contact current source connected between the emitter contact of said first transistor and reference potential, the emitter contact of said second transistor being connected to the other of said inputs of said operational amplifier, a second constant current source connected between the emitter contact of said second transistor and the reference potential, and an output of the controller connected to said output of said operational amplifier, whereby the ratio of the current of said second constant current source to the current of said first constant current source provides set-point setting.

2. Circuit according to claim 1, including third and fourth constant current sources, a third transistor having emitter, collector and base contacts and being connected between said first transistor and said one input of said operational amplifier forming a Darlington stage, the emitter contact of said first transistor being connected to the base contact of said third transistor Tc, the emitter contact of said third transistor being connected to said one input of said operational amplifier and through said third constant current source to the reference potential; a fourth transistor having emitter, collector and base contacts and being connected between said second transistor and said other input of said operational amplifier forming another Darlington stage, the emitter contact of said second transistor being connected to the base contact of said fourth transistor, the emitter contact of said fourth transistor being connected to said other input of said operational amplifier and through said fourth constant current source to the reference potential, the collector contacts of said third and said fourth transistors each being connected to a potential; whereby in addition to the ratio of the current of said first constant current source to the current of said second constant current source, the ratio of the ratios of the current of said third constant current source to the current of said first constant current source to the ratio of the current of said fourth constant current source to the current of said second constant current source provide the set-point valve setting.

3. Circuit according to claim 2, wherein the potential to said collector contacts of said first and second transistors is a common first supply potential.

4. Circuit according to claim 3, wherein said one input of said operational amplifier connected to said emitter contact of said first transistor is a non-inverting input, and said other input of said operational amplifier connected to the emitter contact of said second transistor is an inverting input.

5. Circuit according to claim 4, including fifth, sixth, seventh and eighth transistors having emitter, collector and base contacts, said fifth and said sixth transistors being of the same type, said seventh and said eighth transistors being of a type complementary to the type of said fifth and said sixth transistor, the base contact of said fifth transistor forming said inverting input of said operational amplifier, the base contact of said sixth transistor forming said non-inverting input of said operational amplifier, the collector contacts of said fifth and said sixth transistors being connected to a potential, the emitter contact of said fifth transistor being connected to the emitter contact of said seventh transistor and the emitter contact of said sixth transistor being connected to the emitter contact of said eighth transistor, the base contacts of said seventh and said eighth transistors being connected to the collector contact of said seventh transistor, other constant current sources each being connected between a respective one of the collector contacts of said seventh and said eighth transistor, and the reference potential, and said output of said operational amplifier connected to said output of the controller being the collector contact of said eighth transistor.

6. Circuit according to claim 5, wherein the potential connected to the collector contacts of said fifth and said sixth transistors is said first supply potential.

7. Circuit according to claim 2, including a resistor connected between the base contact of said second transistor and the base contact of said first transistor, and a second capacitor connected between the base contact of said first transistor and the reference potential.

8. Circuit according to claim 7, wherein the reference potential is ground.

9. Circuit according to claim 2, wherein the reference potential is ground.

10. Circuit according to claim 1, wherein the reference potential is ground.

* * * * *